US007015750B2

(12) United States Patent
Gupta

(10) Patent No.: US 7,015,750 B2
(45) Date of Patent: **\*Mar. 21, 2006**

(54) METHOD FOR LOWERING NOISE AND PROVIDING OFFSET CORRECTION IN A TRANSIMPEDANCE AMPLIFIER

(75) Inventor: Sandeep K. Gupta, Aliso Viejo, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/094,254

(22) Filed: Mar. 31, 2005

(65) Prior Publication Data

US 2005/0168276 A1    Aug. 4, 2005

Related U.S. Application Data

(63) Continuation of application No. 10/227,257, filed on Aug. 26, 2002, now Pat. No. 6,882,218.

(51) Int. Cl.
*H03F 1/02* (2006.01)
(52) U.S. Cl. .......................... 330/9; 330/226; 327/341; 327/562
(58) Field of Classification Search .................... 330/9, 330/260, 83, 97, 121, 252–255, 262–265, 330/271, 275, 308, 310; 250/214 AG, 214 A; 327/341, 513, 560–563; 398/202
See application file for complete search history.

(56) References Cited

U.S. PATENT DOCUMENTS

| 4,050,086 | A | 9/1977 | Harr .............................. 360/66 |
| 4,270,092 | A | 5/1981 | Christopherson |
| 4,529,947 | A | 7/1985 | Biard et al. |
| 4,545,076 | A | 10/1985 | Biard et al. |
| 4,724,315 | A | 2/1988 | Goerne ................... 250/214 A |
| 5,025,456 | A | 6/1991 | Otu et al. ...................... 375/76 |
| 5,132,609 | A | 7/1992 | Nguyen |
| 5,345,073 | A | 9/1994 | Chang et al. |
| 5,430,765 | A | 7/1995 | Nogahori ..................... 375/318 |
| 5,455,705 | A | 10/1995 | Gusinov ...................... 398/202 |
| 5,471,665 | A | 11/1995 | Pace et al. ................... 455/343 |

(Continued)

FOREIGN PATENT DOCUMENTS

EP    0736 968    10/1996

OTHER PUBLICATIONS

Copy of European Search Report for European Appln. 03019210.8-2215, dated Oct. 28, 2004.

*Primary Examiner*—Timothy P. Callahan
*Assistant Examiner*—Hai L. Nguyen
(74) *Attorney, Agent, or Firm*—Sterne, Kessler, Goldstein & Fox P.L.L.C.

(57) ABSTRACT

A system for receiving signals (e.g., optical signals) includes an input device, an amplification device, and a feedback device. The amplification device receives a signal from the input device and includes a transimpedance portion. The transimpedance portion includes a first section having a plurality of elements (e.g., resistors and transistors) and a second section having a plurality of elements (e.g., resistors and transistors). One or more of the elements (e.g. transistors or resistors) in the first and second sections are mismatched to introduce a systematic offset in the transimpedance stage, to make the net input referred offset of the amplification device unidirectional. The feedback device (e.g. an integrator) is coupled to an output of the amplification device and an input of the transimpedance portion to provide a unidirectional offset correction to the amplification device for reduced noise enhancement.

11 Claims, 4 Drawing Sheets

U.S. PATENT DOCUMENTS

| | | | |
|---|---|---|---|
| 5,508,645 A | 4/1996 | Castellucci et al. | 327/77 |
| 5,539,779 A | 7/1996 | Nagahori | |
| 5,612,810 A | 3/1997 | Inami et al. | 398/202 |
| 5,689,407 A | 11/1997 | Marinus et al. | 363/21 |
| 5,777,507 A | 7/1998 | Kaminishi et al. | |
| 6,018,407 A | 1/2000 | Hatakeyama et al. | |
| 6,160,450 A | 12/2000 | Eschauzier et al. | 330/253 |
| 6,175,438 B1 | 1/2001 | Agarwal et al. | 398/212 |
| 6,225,848 B1 * | 5/2001 | Tilley et al. | 327/307 |
| 6,262,625 B1 | 7/2001 | Perner et al. | 330/2 |
| 6,275,541 B1 | 8/2001 | Nagahori et al. | 375/318 |
| 6,342,694 B1 | 1/2002 | Satoh | 250/214 A |
| 6,388,521 B1 | 5/2002 | Henry | 330/258 |
| 6,404,281 B1 | 6/2002 | Kobayashi | 330/85 |
| RE37,944 E | 12/2002 | Fielder et al. | |
| 6,525,604 B1 | 2/2003 | Eckert et al. | 330/69 |
| 6,583,671 B1 | 6/2003 | Chatwin | 330/279 |
| 6,658,244 B1 * | 12/2003 | Schmal et al. | 455/296 |
| 6,720,830 B1 | 4/2004 | Andreou et al. | 330/253 |
| 6,750,712 B1 | 6/2004 | Hoang | 330/252 |
| 6,882,218 B1 * | 4/2005 | Gupta | 330/9 |
| 2004/0036536 A1 | 2/2004 | Gupta | |

* cited by examiner

METHOD FOR LOWERING NOISE AND PROVIDING OFFSET CORRECTION IN A TRANSIMPEDANCE AMPLIFIER

CROSS-REFERENCE TO RELATED APPLICATIONS

The application is a continuation if U.S. Ser. No. 10/227,257, filed Aug. 26, 2002 (now U.S. Pat. No. 6,882,218 B2), which is incorporated by reference herein in its entirety.

BACKGROUND OF THE INVENTION

1. Field of the Invention

The present invention is directed to using offset correction to lower noise in a transimpedance stage of an amplifier.

2. Background Art

Transimpedance amplifiers (TIAs) and limiting amplifiers (LAs) are typically used in optical receivers, and other devices. The are positioned at front end stages of a system to convert current from a detector (e.g., a photodetector) to voltage output, which is then fed to a clock and data recovery (CDR) circuit. TIAs in high speed communications (e.g., 10 GHz/s baud rates) are often faced with stringent requirements for reducing the input referred noise. This is needed to maximize the signal-to-noise ratio (SNR) of the TIAs. This results in lower bit error rates (BERs) when the TIAs are used in optical receiving devices (e.g., photodetectors, optical sensors, optical detectors, or the like). Often, the limiting amplifier (LA) receives a signal from the TIA to limit a signal generated by the TIA before the signal is sent into the clock and data recovery circuit (CDR). In other cases, TIA's themselves can be implemented as a transimpedance first stage followed by one or more amplifier stages. Usually, a feedback device is positioned between an output of the TIA and an input of the transimpedance first stage of the TIA to generate a feedback signal that removes unidirectional currents D.C. offset or any other D.C. offset that exists in all the stages of the amplifier. Unfortunately, the feedback device results in additional noise in the design of the transimpedance amplifier.

Therefore, what is needed is an improved topology for a transimpedance first stage, which can reduce noise in the TLA to an acceptable level. What is also needed other mechanisms to reduce noise specifically in the first stage of the transimpedance stage, which contribute a significant part of the overall noise.

BRIEF SUMMARY OF THE INVENTION

The present invention provides a system including an input device (e.g., a photodetector), an amplification device, and a feedback device. The amplification device receives a signal from the input device and includes a transimpedance portion that converts the input current to a voltage. The transimpedance portion includes a first section having a plurality of elements (e.g., resistors and transistors) and a second section having a plurality of elements (e.g., resistors and transistors). The elements (e.g., transistors and resistors) in the first and second sections are mismatched to introduce a systematic offset in the transimpedance stage to make a net input offset at the amplification device unidirectional. The feedback device (e.g., an integrator) can be coupled to an output of the amplification device and an input of the transimpedance portion to provide a single ended unidirectional offset correction to the amplification device for reduced noise enhancement.

The present invention further provides a transimpedance stage of an amplifier. The transimpedance stage includes a first section having a plurality of elements (e.g., resistors and transistors) and a second section having a plurality of elements (e.g., resistors and transistors). The transistors in the first and second sections are mismatched, and when implemented as MOSFETs, have different width to length ratios.

The present invention also provides a method including the step of providing at least a first element in a first section of a stage of an amplification system. The method also includes the step of providing at least a first, similar element in a second section of the stage of the amplification system. The method also includes the step of introducing a systematic offset to make a net offset unidirectional by having the first element in the first section have a different impedance value than the first similar element in the second section.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

Figure 1:
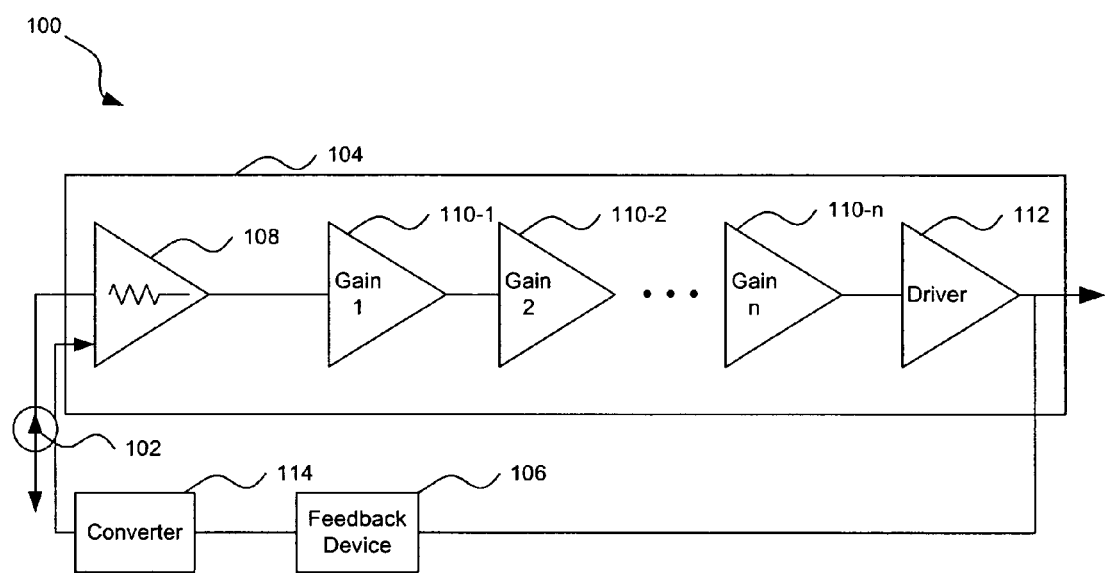
FIG. 1 shows a system with a transimpedance amplifier according to embodiments of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

FIG. 1 shows a system (e.g., an optical receiving system) 100 according to embodiments of the present invention. System 100 includes an optical receiving device (e.g., photodetector, optical detector, or optical sensor) 102 that feeds a signal (e.g., a current) into a transimpedance amplifier (TIA) 104, which converts the signal to a voltage signal and amplifies the signal for later processing. In some embodiments, the signal is a current based on an optical signal detected by optical receiving device 102. TIA 104 feeds back an output signal through a feedback device (e.g., a D.C. loop circuit or an integrator) 106 to an input of the TIA 104. TIA 104 can include a first stage (e.g., a transimpedance stage) 108, first through n second stages (e.g., gain stages) 110-1 to 110-$n$, and a third stage (e.g., a driver device or stage) 112. There can also be a converter (e.g., a voltage to current (V/I) converter) 114 positioned between feedback device 106 and TIA 104.

In some embodiments, a large gain can be required through TIA 104. This can cause amplification of the offset produced through a first few gain stages 110. This can be especially true when using complimentary metal oxide semiconductor (CMOS) devices, where the offsets from the individual first few gain stages 110 can be large even after careful layout matching. Thus, a servo mechanism (e.g., feedback device 106) can be used to cancel out the input referred offset of the entire system 100.

The D.C. offsets of the individual gain stages 110 can be positive or negative. Photodetector 102 produces unidirectional positive offsets because it can only force current in one direction. Thus, a positive or negative combined offset will be present at the output of the TIA 104 after summing of the gain stage offsets and the photodetector offsets. The feedback device 106 usually cancels out the summed offsets.

Figure 2:
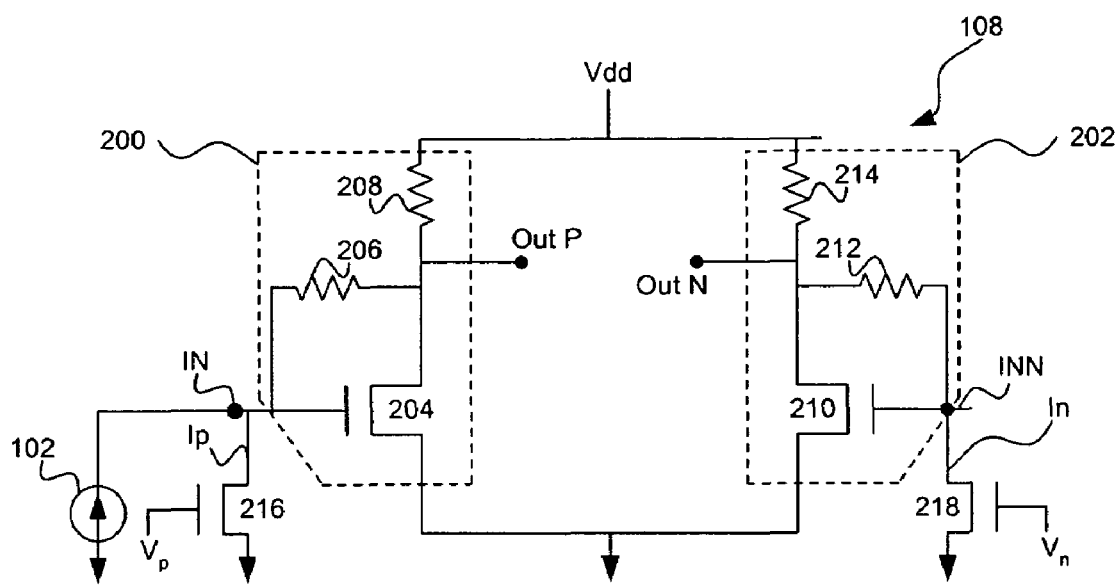
FIG. 2 shows a transimpedance first stage in the system of FIG. 1.

FIG. 2 shows a circuit diagram of a transimpedance first stage 108. MOSFETs or any other type of transistors can be used without departing from the scope of the present invention. Transimpedance first stage 108 includes a first section 200 and a second section 202. First section 200 includes a transistor 204 (e.g., a MOSFET) coupled between Vdd and ground. First section 200 also includes a first resistor (e.g., a feedback resistor) 206 connected between a gate and drain of transistor 204 and a second resistor (e.g., a load resistor) 208 coupled between Vdd and the drain of MOSFET 204. A node Out P is at a connection of first and second resistors 206 and 208, respectively, and the drain of MOSFET 204. Second section 202 has similar connections for MOSFET 210, resistors 212 and 214, and node Out N.

With continuing reference to FIG. 2, first section 200 receives the signal from photodetector 102 and uses MOSFET 204 as an amplifier with resistor 206 in feedback to achieve transimpedance, while maintaining high bandwidth. Second section 202, which as discussed above is a replica of first section 200, provides a replica bias voltage Out N to the subsequent gain stage 110-1. A single ended signal is converted to a differential signal at gain stage 110-1.

Figure 3:
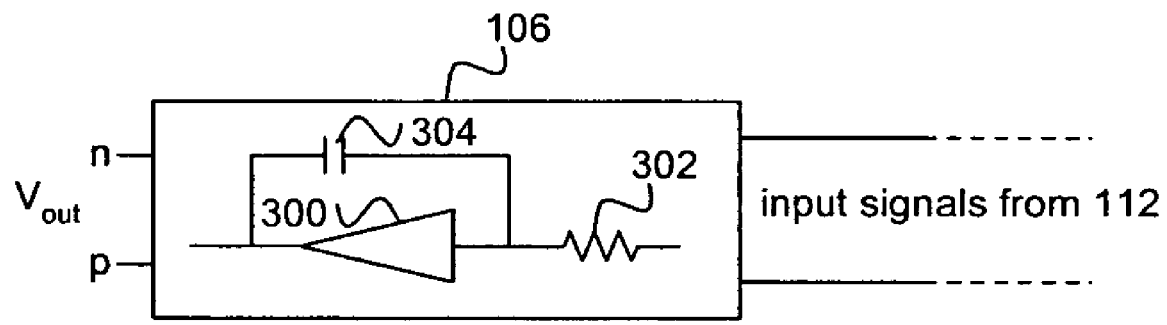
FIG. 3 shows a feedback device in the system of FIG. 1.

FIG. 3 shows the feedback device 106 according to an embodiment of the present invention. Feedback device 106 can be configured as an integrator including an operational amplifier 300 having a resistor 302 at its input and a capacitor 304 coupled across it. Offset signals can be at very low frequencies (e.g., a D.C. signal), so integrator 106 over time can build up a finite output voltage corresponding to infinitesimally small input signals. An ideal integrator during stable operation has an output voltage tending to provide a "correction offset," so that its input is equal to zero. In practice, however, integrator 106 may not have an infinite gain at D.C.; it will produce an input voltage that is close to, but not equal to, zero.

Again with reference to FIGS. 1 and 2, and with continuing reference to FIG. 3, because the input to TIA 104 is current, when an integrator is used as feedback device 106, then converter 114 is placed after feedback device 106. As shown in FIG. 2, converter 114 can include transistors (e.g., MOSFETs) 216 and 218. MOSFET 216 can convert voltage Vp from feedback device 106 to Ip, which is input to transimpedance stage 108 at node IN. Similarly, MOSFET 216 can convert voltage Vn from feedback device 106 to In, which is input to transimpedance stage 108 at node INN. Also, because the implementation of gain stages 110 are differential for better noise immunity and power supply rejection, integrator 106 can have differential inputs and outputs (e.g., outputs that form intop and inton). Thus, transistors 204 and 210 provides a "correctional" offset current at the inputs IN and INN that is differential in nature, which can provide both positive and negative offset correction.

The embodiment shown in FIGS. 1–3 has some drawbacks. Although second section 202 is configured to provide just D.C. bias voltage to the subsequent stage 110-1 (where differential conversion happens), the feedback resistor 212 contributes an equal amount of input referred noise. This is also true of MOSFET 210 and resistor 214, but their noise contribution can either be the same or smaller than that attributed to resistor 212. Also, MOSFETS 216 and 218 contribute noise, even though their purpose is to cancel D.C. offset current. The noise becomes worse as the current through MOSFETs 216 and 218 increases. MOSFETs 216 and 218 can carry current (e.g., I-216 and I-218, which are not shown in the figures) that only contribute I-216–I-218 to provide cancellation with total input referred offset current. However, based on the common mode output of amplifier 300 in integrator 106, the common mode current through MOSFETS 216 and 218 can be large.

For example, to correct 50 μA input offset current, MOSFETs 216 and 218 can be forced by feedback device 106 to have 650 μA and 700 μA of current, respectively. To correct a 1.2 mA input offset current, MOSFETs 216 and 218 can have 2.2 mA and 1 mA of current, respectively. The greater the bias current through MOSFETs 216 and 218, the more will be their contribution to the input referred noise current. Essentially, this large common mode current as a result of differential offset cancellation leads to extra noise. On the other hand, because both positive and negative current may need to be corrected, either a differential circuit or a push-pull stage having the same problem would be needed. Using single ended, single device feedback may provide only a unidirectional cancellation, which is unacceptable.

Figure 4:
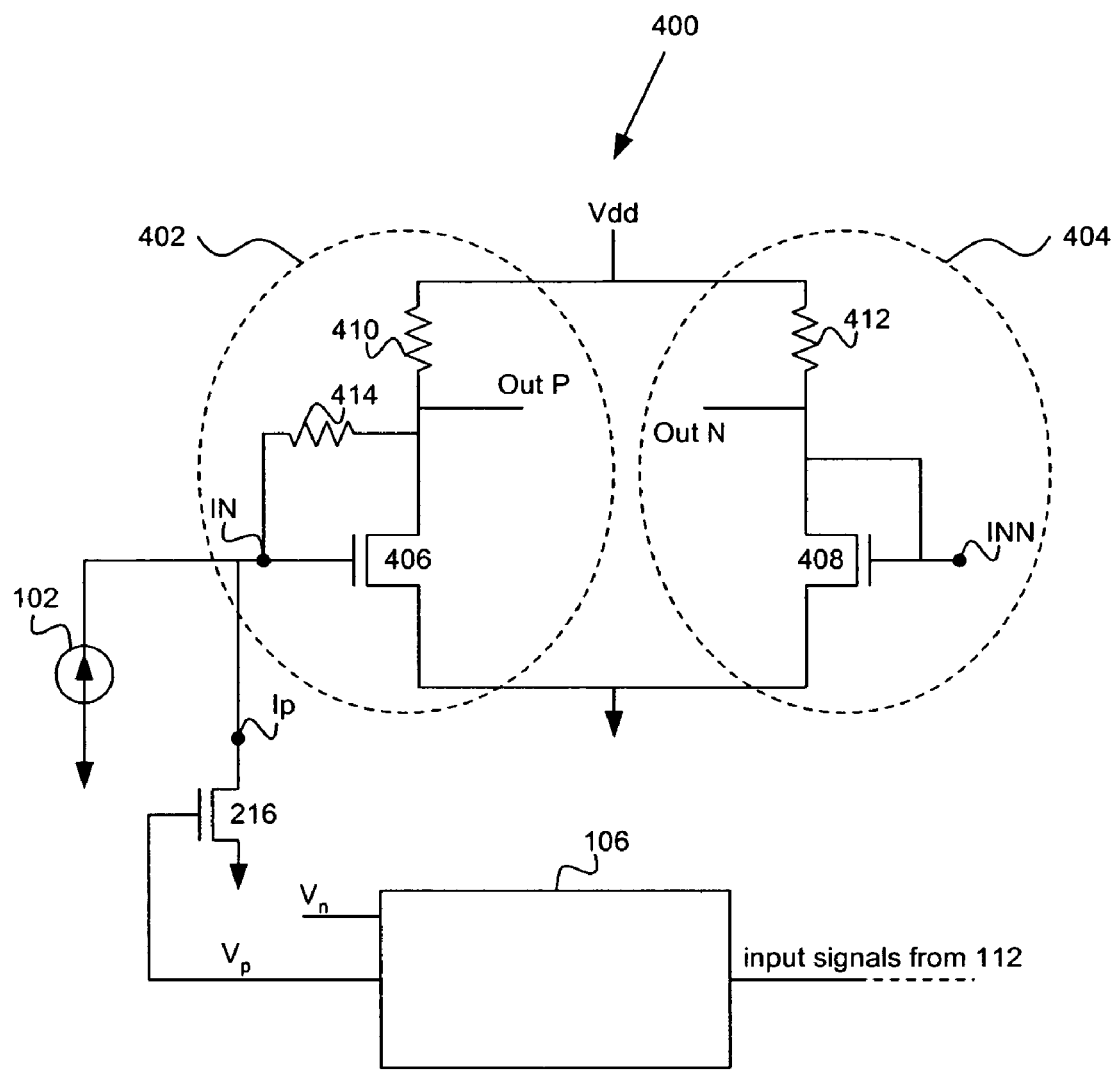
FIG. 4 shows a transimpedance first stage coupled to a feedback device in the system of FIG. 1 according to other embodiments of the present invention.

FIG. 4 shows transimpedance stage 400 according to another embodiment of the present invention that overcomes the above mentioned drawbacks. The configuration of transimpedance stage 400 is similar to transimpedance stage 108 with two sections 402 and 404 having transistors 406 and 408 and load resistors 410 and 412. However, only first section 402 has a feedback resistor 414, as discussed in more detail below. This configuration eliminates the problem of bi-directional offset by introducing a known offset in transimpedance stage 400. This offset is introduced utilizing either transistors 406 and 408 or load resistors 410 and 412. An offset is introduced by mismatching impedance values or device sizes, so that equivalent input referred offset by this unidirectional systematic offset is enough to overcome the effect of the other random offsets in transimpedance stage 400 and the first few gain stages 110.

With continuing reference to FIG. 4, either transistors 406 and 408 or resistors 410 and 412 are mismatched by a predetermined amount. For example, a width-to-length (W/L) ratio of transistor 406 can be made a predetermined amount larger (e.g., maybe a range of 10–20%) than a W/L ratio of transistor 408. To ensure that the sum of this systematic offset and the random offsets that could exist is in the same direction as the photodetector input offset, that is all offset correction that now needs to be done is unidirectional. By making first section 402 nonsymmetrical with respect to second section 404, noise can be further reduced by eliminating feedback resistor 212 that was in second section 202, which can contribute a large amount of noise. In essence, transistor 408 becomes diode connected.

Thus, as shown in FIG. 4, by eliminating a feedback resistor in second section 404, a substantial noise reduction is achieved (e.g., a 25–30% reduction in noise). Also, by using single ended feedback, no common mode current is needed, which: (1) eliminates the noise of an additional device, and (2) reduces the required current to cancel normal amounts (e.g., 1.2 mA) of net input referred offset current. This allows a size or impedance of transistor 408 to be reduced, reducing both current through and noise from transistor 408. These two factors combine to result in a reduction of input referred noise due to transimpedance first stage 400 by up to 30–40%. This is a great advantage in systems requiring high speeds and low noise.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method, comprising:
    (a) forming a differential amplifier in a transimpedance section of an amplification device;
    (b) coupling a first section of the differential amplifier, the first section having a plurality of elements including at least a transistor, to a second section of the differential amplifier, the second section having a plurality of elements including at least a transistor;
    (c) mismatching one or more of the plurality of elements in the first section with respect to corresponding ones of one or more plurality of elements in the second section, such that a systematic offset in the transimpedance stage is introduced, which makes a net offset of the amplification device unidirectional; and
    (d) coupling a feedback device to an output of the amplification device and an input of the differential amplifier of the transimpedance portion to provide a unidirectional offset correction to the amplification device.

2. The method of claim 1, wherein the one or more plurality of elements in the first section and the second section includes at least a resistive element and step (c) comprises:
    mismatching an impedance value of the resistive element in the first section with respect to an impedance value of the resistive element in the second section.

3. The method of claim 2, wherein the resistive element in the first section has a higher impedance value than the resistive element in the second section.

4. The method of claim 2, wherein the resistive element in the first section has a lower impedance value than the resistive element in the second section.

5. The method of claim 1, wherein step (b) comprises:
    using field effect transistor (FET) devices as the transistors.

6. The method of claim 5, wherein a FET in the at least one FETs in the first section has a larger width to length ratio than a FET in the at least one FETS in the second section.

7. The method of claim 1, wherein step (b) comprises only providing the first section with a transimpedance resistor.

8. The method of claim 1, wherein step (d) comprises using an integrator as the feedback device.

9. The method of claim 1, further comprising:
    (e) coupling a converter between the feedback device and the amplification device.

10. The method of claim 9, wherein step (e) comprises using a voltage-to-current converter as the converter.

11. The method of claim 1, wherein step (c) comprises using similar elements for the one or more of the elements in the second section being mismatched with respect to the elements in the first section.

* * * * *